(12) United States Patent
Schedel et al.

(10) Patent No.: US 6,780,552 B2
(45) Date of Patent: Aug. 24, 2004

(54) METHOD FOR CONTROLLING THE QUALITY OF A LITHOGRAPHIC STRUCTURING STEP

(75) Inventors: Thorsten Schedel, Dresden (DE); Jens Zimmermann, Dresden (DE); Sebastian Schmidt, Dresden (DE)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 10/175,591

(22) Filed: Jun. 19, 2002

(65) Prior Publication Data

US 2003/0039905 A1 Feb. 27, 2003

(30) Foreign Application Priority Data

Jun. 19, 2001 (EP) .............................................. 01114670

(51) Int. Cl.[7] ................................................. G03F 9/00
(52) U.S. Cl. .......................................... 430/30; 430/22
(58) Field of Search ...................................... 430/22, 30

(56) References Cited

U.S. PATENT DOCUMENTS

| 5,790,254 A | 8/1998 | Ausschnitt | 356/372 |
|---|---|---|---|
| 5,866,437 A | 2/1999 | Chen et al. | 438/14 |
| 5,928,822 A | * 7/1999 | Rhyu | 430/30 |
| 5,965,309 A | * 10/1999 | Ausschnitt et al. | 430/30 |
| 5,968,693 A | * 10/1999 | Adams | 430/30 |

* cited by examiner

Primary Examiner—Christopher G. Young
(74) Attorney, Agent, or Firm—Laurence A. Greenberg; Werner H. Stemer; Ralph E. Locher

(57) ABSTRACT

After exposing a semiconductor wafer, quality parameters, for example, the critical dimension, the overlay accuracy, and alignment parameters, etc. are measured in successive inspections and are compared with tolerance range widths that are specified dynamically by calculating the range from measured values of one or more of the other quality parameters. For example, the tolerance range width for the overlay accuracy can be increased for smaller measured critical dimension values of the same structures without affecting the functionality of the integrated circuit. Using a forward mechanism, the tolerance ranges can also be adjusted with the quality parameter measurements from a first layer to the quality parameter tolerance range width of a second layer.

11 Claims, 3 Drawing Sheets a)

b)

METHOD FOR CONTROLLING THE QUALITY OF A LITHOGRAPHIC STRUCTURING STEP

BACKGROUND OF THE INVENTION

Field of the Invention

The present invention relates to a method for controlling the quality of a lithographic structuring step performed in an exposure tool for structuring a pattern into a photoresist layer of a semiconductor wafer. The quality is represented by a group of at least two quality parameters measured in at least one metrology tool.

Semiconductor wafers commonly experience multiple exposure steps followed by other processing steps like etching, polishing, etc. in order to be finally structured with one or more integrated circuits. Due to the steadily increasing customer specifications that have to be fulfilled, the quality performance of each exposure step is controlled by a set of metrology measurements.

The quality of an exposure step can be represented by a group of quality parameters like the critical dimension, the overlay accuracy from layer to layer, the layer thickness, the absolute position accuracy (registration), etc. The strength of the requirements to be fulfilled by an integrated circuit, i.e. a wafer, typically depend on the layer that is actually being structured. For example, some layers are structured with dense patterns, such that narrow tolerance ranges for the critical dimension exist. In other cases, two subsequent layers, one being structured above the other, require a minute adjustment to each other to provide contacts having a minimum cross-section in order to guarantee an accurate working function of the integrated circuit.

A set of tolerance specifications for the quality parameters are commonly deduced from the design rules and the layer architecture combined with current technology feasibilities. The specifications are generally provided prior to starting mass production of the wafers in a fabrication facility. That is, each of the metrology tools that measures at least one of the quality parameters is connected to a product database containing the pattern design files. The quality check, i.e. the comparison whether the just measured quality parameter is within the prescribed tolerance range for that parameter, is performed either on the metrology tool after having received the tolerance specification information, or after transferring its measured values to the MES-system (manufacturing execution system), which performs electronic data collection.

Unfortunately, the amount of rework is growing with the advent of tighter tolerance specifications introduced with advanced technologies. This is because when the measured values of a wafer do not fulfill the specified tolerances, the wafer must be reworked, i.e. the resist has to be stripped off, and a new coating step has to be performed after which the wafer is re-exposed. This disadvantageously increases the costs in material and tool time and also results in a loss in yield. A remedy would be to decrease the strength of tolerance specifications, but this will lead to a disadvantageous loss in competitiveness to other manufacturers.

SUMMARY OF THE INVENTION

It is accordingly an object of the invention to provide a method for controlling the quality of a lithographic structuring step which overcomes the above-mentioned disadvantages of the prior art methods of this general type.

In particular, it is an object of the invention to reduce the amount of rework, thereby decreasing the costs related to exposing a semiconductor wafer.

With the foregoing and other objects in view there is provided, in accordance with the invention, a method for controlling quality of a lithographic structuring step performed in a lithographic structuring tool for structuring a pattern into a layer of a plate-like object. The method which includes steps of: representing the quality by a group of at least two quality parameters including a first quality parameter representing a property of the pattern and a second quality parameter representing a property of the pattern being different than the property represented by the first quality parameter; measuring the first quality parameter in a first metrology tool; providing at least one value of the first quality parameter; calculating a width of a tolerance range for the second quality parameter in response to providing the at least one value of the first quality parameter; providing the plate-like object to the second metrology tool; measuring the second quality parameter in a second metrology tool; and comparing the second quality parameter with the width of the tolerance range that has been calculated.

The method is particularly advantageous in the case when the plate-like object is a semiconductor device, e.g. a semiconductor wafer, and the lithographic tool is an exposure tool, for example, a wafer scanner or stepper, or an x-ray, EUV-, ion or electron beam projection tool. An etching tool can be also used as a structuring tool to apply the inventive process window handling method.

The plate-like object can be any object, which can be structured on its surface, e.g. a mask or reticle, or a flat panel display.

According to the present method, the quality parameters are measured subsequently in one, two, three, or more metrology tools after the exposure of a semiconductor wafer are checked for validity in dependence from the respective other measurement results. This means that the measurement result of a first measured quality parameter has an influence on the tolerance specification for the second or any further quality parameter being measured afterwards, or even prior to the current measurement, when the validity check of the first quality parameter is taken a posteriori.

In the prior art, each quality parameter, such as the critical dimension, the overlay accuracy, the layer thickness, the position accuracy, or the alignment parameters, for example, grid scaling, magnification, rotation, etc.—the latter ones being derived, e.g., in overlay metrology tools—are each compared against a specific tolerance range specified in advance of the begging of the wafer production. Instead of using these rigidly set tolerance ranges, the present method provides a flexible use of ranges, which utilizes advantageous conditions. This is fulfilled by a first measured quality parameter, used to adjust the tolerance range, which is applied to the validity check of the second measured quality parameter.

The advantage of the present method is obtained from the physical or geometrical interdependence of the metrology or quality parameters involved. A specific value measured for one parameter can have a direct influence on the degree of freedom of another parameter. For example, an increased value of the critical dimension of a structure might increase a tolerance range width of an overlay accuracy for a contact hole to which it should be connected, or vice-versa, decreases the tolerance range width for a structure that is to be placed directly beside the first structure, if they are not supposed to be connected. Therefore, data of actually structured patterns—perhaps in combination with design data—are used as inputs to derive tolerance range widths instead of using design data only.

Since the dynamic determination of the tolerance range width of the second quality parameter allows an adaptation of the quality check to the current and actual requirements of the design patterns on the wafer under investigation, the dynamic tolerance range widths will generally be larger than those specified rigidly according to prior art. In particular, the process window in a quality parameter plane can be extended into regions, where the functionality of the integrated circuit can still be warranted depending on the specific combination of values for the first and second quality parameter. Thus, rework is advantageously reduced, thereby decreasing costs needed for material and machines.

The inventive method works with any sequence of measuring quality parameters. Typically, semiconductor wafers will be taken from the lithography track after exposure and the overlay control is measured first, followed by a critical dimension measurement, or vice versa. Then, the wafer may be deposited back on the track for further processing if both or more measurements of parameter values lie within the calculated tolerance range widths. Since according to this method, a larger space of valid parameter combinations, i.e. pairs or triples etc., of measured quality parameters that fulfill the tolerance ranges are specified and calculated, semiconductor wafers, which in the prior art methods would be sent into rework due to excessive parameter values, might now pass the examination successfully. This is due to the calculation step that can be chosen to consider all relevant requirements inferred from the design and combined with data from actually built structures.

The present method is not necessarily restricted to first measuring a first quality parameter that is measured and compared with a rigidly set tolerance range width, after which the present method is applied with the calculated tolerance range width for performing the second comparison. Rather, it is also possible to perform both measurements for both parameters, and then to transfer the measured values for the quality parameters to the respective other tool, i.e. exchanging the values. Thereby, the method is applied to each of the tools with respect to the semiconductor wafer under investigation. The calculation step is then performed in response to the transferred/exchanged complementary parameter value.

Generally, it is also possible that the transferred quality parameter value is not measured, but derived by statistical means, e.g. mean values derived from a lot to which the semiconductor wafer belongs.

In a further aspect, an error signal is issued if the quality parameter, which is measured at second, third, fourth, etc. place, exceeds the tolerance range, the width of which has been calculated according to the method. The signal can be forwarded to the host of the corresponding metrology tool, thereby warning the operator about the occurrence of an examination failure, or the signal can be transferred to the fabrication-wide electronic data collection system, which allows further data analysis.

As a result of this, a rework operation can be performed on a semiconductor wafer, when the measured value exceeds the dynamically determined tolerance range.

In a further aspect, the dynamic specification leading to the calculated tolerance range width retrieves its informational input from the design rules corresponding to the current product. Nevertheless, fine tuning of the tolerance range can also be performed with input from experimental data using test wafers varying focus exposure and alignment parameters, thereby scanning the focus parameter and the alignment parameter range in a matrix form.

In a further aspect, the first quality parameter is derived from a first measurement in a first metrology tool. The first quality parameter can possibly be checked against a specified rigid tolerance range. The measured value of the first quality parameter may then be transferred to the second metrology tool that measures the second quality parameter after performing the tolerance range calculation, or can be transferred to the fabrication-wide electronic data collection system for performing the calculation step. In a further aspect, the first quality parameter is the critical dimension of the pattern. In combination with a still further particularly advantageous aspect, the second quality parameter is the overlay accuracy of two recent layers. As stated in a previous example, the critical dimension and the overlay accuracy have a strong interrelation with respect to obeying old design rules.

Nevertheless, in two further aspects, the first and second quality parameters measure the same quality. In a first of those aspects, the first quality parameter is measured in a first layer and the second quality parameter is measured in a second layer that is different from the first layer. This aspect of the method can advantageously be applied to the common case that two, e.g., subsequent layers include a structure design, which depends on each other. Thus, if a quality parameter in one of these layers acquires a first value by measurement, the second quality parameter measuring the same quantity of the corresponding structure in the layer above, can advantageously be compared with a tolerance range width that is determined and calculated from the conditions of the corresponding structure below. For example, a poorly structured pattern in the lower layer, i.e. a measured first quality parameter slightly exceeding the rigid tolerance range width specified according to the prior art, can be remedied by an accurately structured second quality parameter, such that the pattern providing the integrated circuit is not damaged by the design rule violation.

The other of the two aspects considers the same quantity to be measured in an x- and y-direction. An example would be a structure that has to fulfill overlay conditions like a minimum cross-section with a different second structure in an underlying layer. The quality parameters are the overlay accuracy in both the x- and y-direction. If the second structure has a structure boundary extending in a diagonal form across its layer, and will be overlaid by the current structure for which the parameters are to be derived and measured, it may occur that a misalignment in x-direction can be outweighed by another misalignment in y-direction in order to maintain cross-section validity.

Other features which are considered as characteristic for the invention are set forth in the appended claims.

Although the invention is illustrated and described herein as embodied in a method for controlling the quality of a lithographic structuring step, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
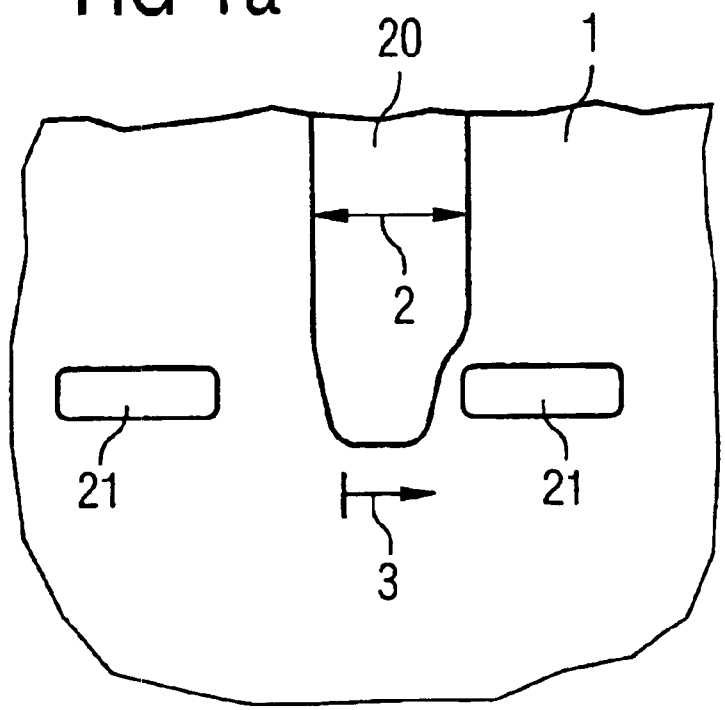
FIG. 1A shows a contact hole having an overlay in accuracy, which is etched between two gate electrodes with a small critical dimension.
Figure 1B:
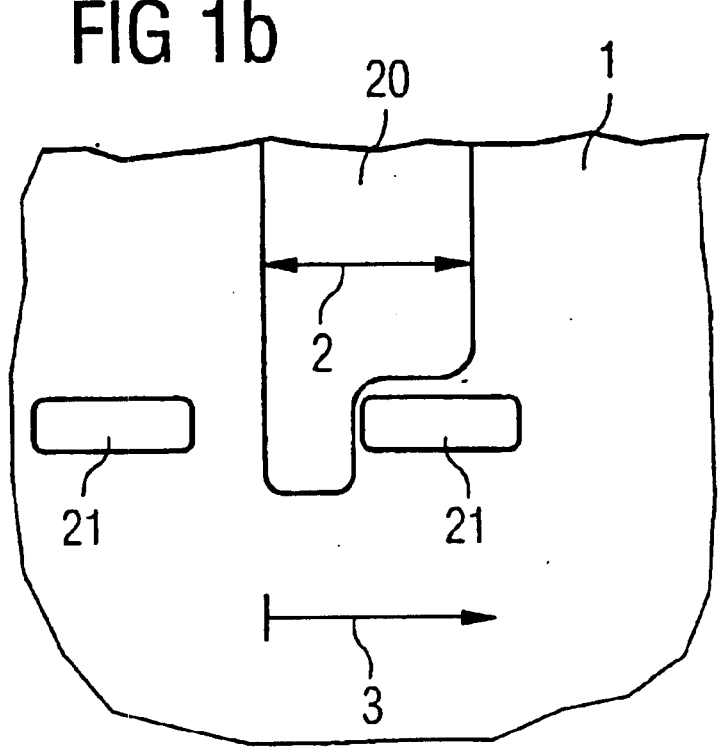
FIG. 1B shows a contact hole having an overlay in accuracy, which is etched between two gate electrodes with a large critical dimension.

The interrelation between the quality parameters due to the requirement of a non-violation of the design pattern function is shown in FIGS. 1A and 1B. There, a semiconductor wafer 1 has arrived at the processing status in which the contact hole 20, which has been etched towards the substrate between two gate electrodes of a DRAM-pattern (Dynamic Random Access Memory), is being filled. The gate electrodes 21 are protected by liners, such that a contact between the contact hole 20 and the gate electrode 21 is prohibited. Nevertheless, a sufficient cross-section of the contact hole that is filled, for example, with poly-silicon must exceed a minimum value in order to establish a contact to the bit line for accessing the capacitor current information.

A contact hole 20 having a comparatively small critical dimension and a moderate amount of overlay accuracy 3 is shown in FIG. 1A. From this figure, it becomes clear that the requirement of a minimum cross-section, i.e. the bottom section of contact hole 20, admits a complicated space in a plane given by critical dimension 2 and overlay accuracy 3. If, e.g., the critical dimension 2 is increased as shown in FIG. 1B, the cross-section increases, but half of the contact hole extent is ineffective because the gate electrode 21 is covered.

Moreover, if the overlay accuracy 3 also reveals a larger value of deviation, the cross-section even further decreases. This could be outweighed by an even larger critical dimension 2, as long as the contact hole extent does not lead to other relevant design problems, for example, contacting other lines or contact holes.

The following table gives an example of a specification derived from a gate layer measurement:

| case | gate measurement range CD | contact tolerance range CD |
|------|---------------------------|----------------------------|
| a    | 130 nm–150 nm             | 180 nm–240 nm              |
| b    | 150 nm–170 nm             | 190 nm–230 nm              |

Accordingly, a gate electrode critical dimension measurement of 152 nm leads to a specification tolerance for the corresponding critical dimension of a contact hole in the range of 190 nm–230 nm. In this context, critical dimension measurements of two different layers also define a measure for their respective overlay accuracy to some degree.

Similarly, an overlay accuracy can be provided directly from a critical dimension (CD) measurement:

| Case | contact hole measurement range CD | contact hole tolerance range width of overlay accuracy |
|------|-----------------------------------|--------------------------------------------------------|
| a    | 180 nm–200 nm                     | 90 nm                                                  |
| b    | 200 nm–220 nm                     | 80 nm                                                  |
| c    | 220 nm–240 nm                     | 70 nm                                                  |

E.g., a measured critical dimension of a contact hole of 191 nm (case a) leads to an overlay tolerance range of 90 nm, which provides a broader range, than if a larger critical dimension would have been measured.

Figure 2:
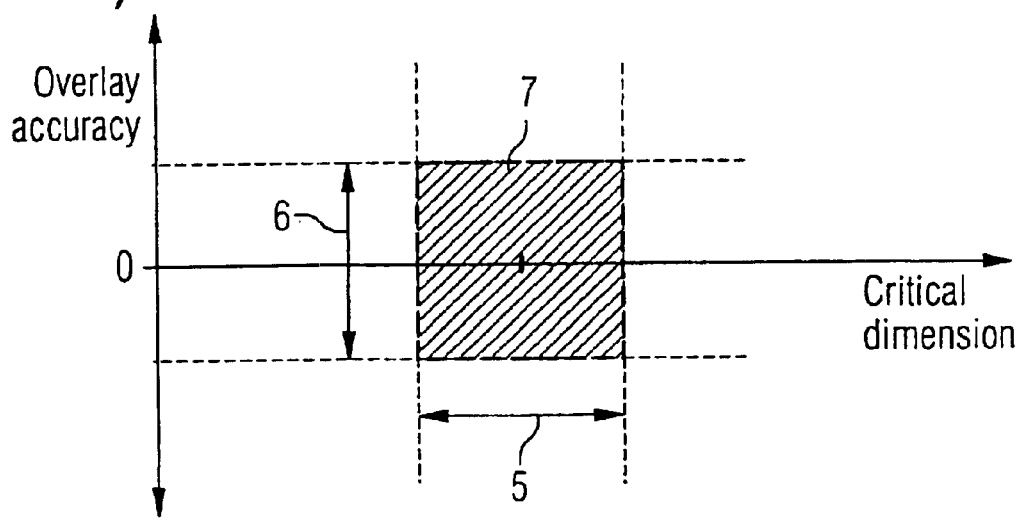
FIG. 2A shows a prior art process window of rigidly specified tolerance ranges including the overlay accuracy and the critical dimension.
FIG. 2B shows a dynamically determined process window in which the tolerance range of a first parameter is a function of a second parameter.
Figure 2:
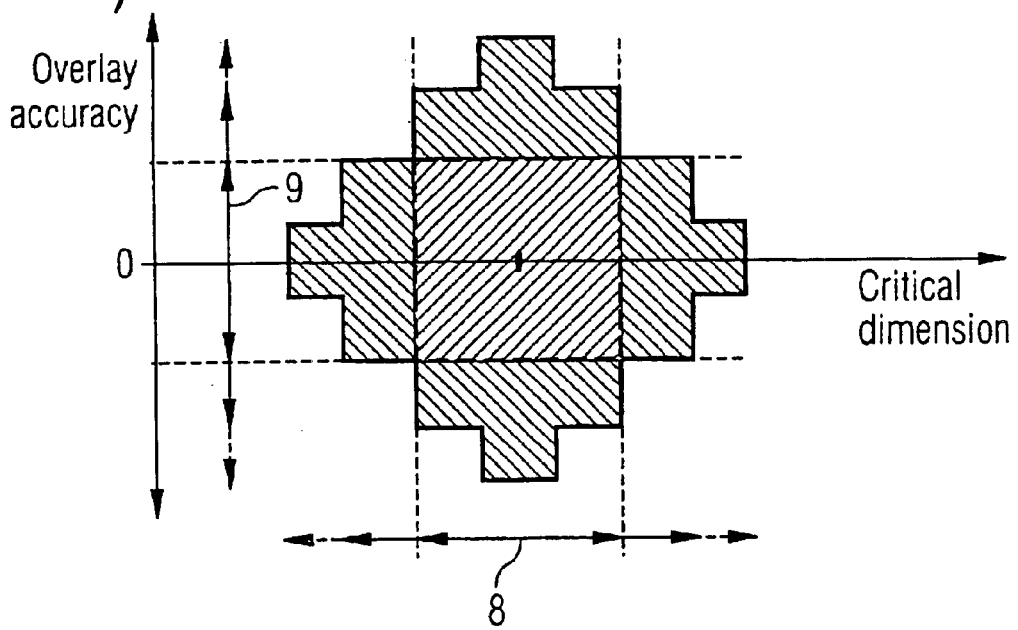

The prior art approach for specifying conditions, i.e. tolerance ranges for each of the parameters—the critical dimension 2 and the overlay accuracy 3, is shown in FIG. 2A. The rigidly specified tolerance ranges 5, 6 that are independent from each other leave just a small space of quality parameter combinations, i.e., pairs of the critical dimension 2 and the overlay accuracy 3. Dynamically produced situations, where the requirement of an operational integrated circuit might be fulfilled although at least one of the limits of the tolerance ranges 6, 7 are violated, are not taken into account.

A set of two tolerance ranges 8, 9 is shown in FIG. 2B. Each of the tolerance ranges 8, 9 is a function of a complementary quality parameter, e.g. the tolerance range 8 for critical dimension 2 is a function of overlay accuracy 3. Advantageously, a larger space of quality parameter combinations as compared with prior art can be provided depending on the design and the actual exposure quality.

Figure 3:
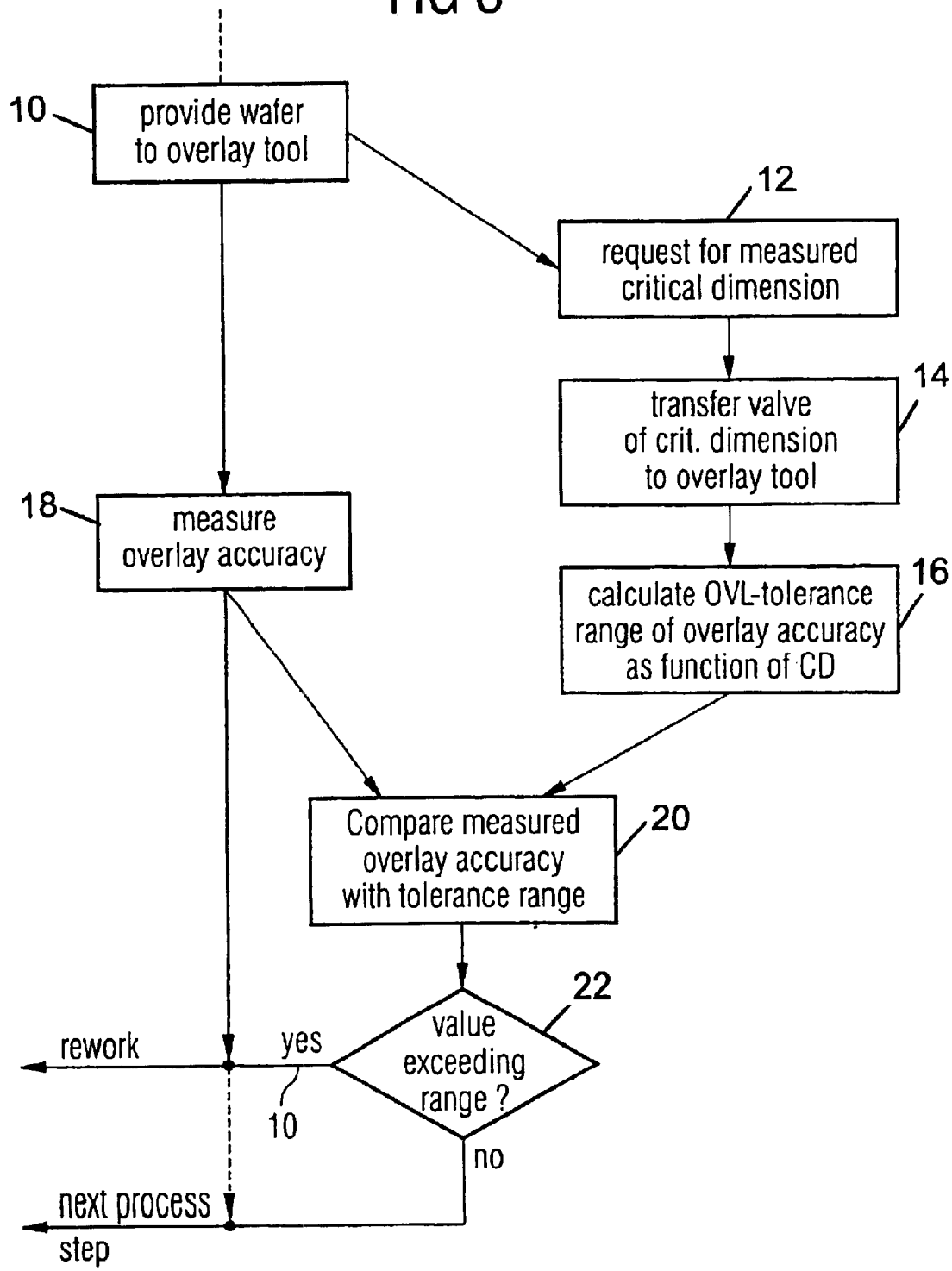
FIG. 3 is a flow chart of the inventive method.

The dynamically determined process window illustrated in FIG. 2b can be calculated according to the embodiment of the inventive method shown in the flow chart of FIG. 3. Only the section of the overlay measurement is shown. After exposure, a semiconductor wafer 1 is first measured for the critical dimension at specific measurement marks. A semiconductor wafer 1 is then forwarded from the optical microscope performing this task to an overlay tool (STEP 10). The host computer of the overlay tool sends a request for the measured critical dimension value (STEP 12), which is associated with the wafer 1 in an EDC-database that is accessible fab-wide, or directly from the optical microscope. This measured critical value is transferred to the overlay tool (STEP 14).

The overlay tool host also acquires design data and builds up a model of the three-dimensional pattern under investigation, to which the actually measured critical dimension data is added. Boundary conditions that will be fulfilled, for example, minimum requirements for contact cross-sections or minimum line-to-line distances, etc. are considered when dynamically calculating a tolerance range for the overlay accuracy (STEP 16). Thus, the overlay accuracy tolerance range particularly depends on the measured value of the critical dimension as provided by the optical microscope in this embodiment.

In the meantime, the overlay accuracy is measured (STEP 18) by the overlay tool and the corresponding value is compared with the overlay tolerance range 9 that has just been derived from the critical dimension 2 (STEP 20). In case the comparison reveals a tolerance limit violation, an error signal 10 is issued leading the operator to initiate a rework operation for the semiconductor wafer 1 (STEP 22). Alternatively, the semiconductor wafer 1 is forwarded to the next process step, for example, developing the resist that previously has been exposed (STEP 22).

According to FIG. 2b, the measured overlay accuracy could also be transferred back to an optical microscope host for, a posteriori, calculating a dynamic tolerance range 8 out of the provided overlay accuracy. A further error signal can then be issued signaling that the corresponding tolerance range limit has been violated.

According to another embodiment relating to memory products, as an example, quality parameters can be calculated from two suited specification parameters s1, s2, which are more abstract than those, which can be measured directly: consider $$s1 = cd1 + cd3 + ovl$$

$$s2 = cd1/2 + cd2 + cd3/2$$

where cd1 is the width of a structure corresponding to an active area that extends between two deep trenches having a width cd3. Both structures overlap with a width ovl, measured in the same direction as cd1 and cd3. There is also a distance cd2 indicating the distance between the active area and a further deep trench. The parameters s1 and s2 are specified with rigid tolerance ranges, but are used for determining dynamic ranges 8, 9 of the quality parameters cd1, cd2, cd3, ovl in this example. In particular, a larger deviation from the ideal value of the measured deep trench width cd3 requires a tighter specification for cd1 and overlay ovl. Therefore s1 and s2 can be used as a formula for performing the calculation step.

We claim:

1. A method for controlling quality of a lithographic structuring step performed in a lithographic structuring tool for structuring a pattern into a layer of a plate-like object, the method which comprises:

providing a semiconductor wafer as the plate-like object;

representing the quality by a group of at least two quality parameters including a first quality parameter representing a property of the pattern and a second quality parameter representing a property of the pattern being different than the property represented by the first quality parameter;

measuring the first quality parameter in a first metrology tool;

providing at least one value of the first quality parameter;

calculating a width of a tolerance range for the second quality parameter in dependence on the at least one value of the first quality parameter;

subsequently providing the plate-like object to the second metrology tool;

measuring the second quality parameter in a second metrology tool; and comparing the second quality parameter with the width of the tolerance range that has been calculated;

issuing an error signal if the second quality parameter exceeds the width of the tolerance range.

2. The method according to claim 1, wherein:

the lithographic structuring tool is an exposure tool;

the lithographic structuring step is an exposure step; and the layer is a photoresist layer.

3. The method according to claim 1, which comprises:

repeating the exposure step in response to the error signal.

4. The method according to claim 1, which comprises:

using pattern design data to perform the step of calculating the width of the tolerance range.

5. The method according to claim 1, which comprises:

defining a first tolerance range width for the first quality parameter prior to performing the step of measuring the first quality parameter;

comparing the first quality parameter with the first tolerance range width; and issuing an error signal, if the first quality parameter exceeds the first tolerance range width.

6. The method according to claim 1, wherein:

the first quality parameter is a critical dimension of the pattern.

7. The method according to claim 6, wherein:

the lithographic structuring step is an exposure step;

the first quality parameter represents a given quantity and the second quality parameter represents the given quantity; and the first quality parameter is measured in a layer that is structured prior to performing the exposure step.

8. The method according to claim 6, wherein:

the first quality parameter represents a given one-dimensional quantity and the second quality parameter represents the given one-dimensional quantity;

the first quality parameter is measured in a first direction of a layer; and the second quality parameter is measured in a second direction of a layer, the second direction being perpendicular to the first direction.

9. The method according to claim 1, wherein:

the lithographic structuring tool is an exposure tool;

the lithographic structuring step is an exposure step;

the layer is a photoresist layer;

the photoresist layer is at least a second layer structured on the semiconductor wafer;

the second quality parameter represents an overlay accuracy of the pattern with respect to a pattern designed in a previous exposure step in another layer of the semiconductor wafer; and the pattern has a given position and the pattern designed in the previous exposure step has been designed to have the given position.

10. The method according to claim 1, which comprises:

providing the first quality parameter to the second metrology tool; and using the second metrology tool to perform the step of calculating the width of the tolerance range.

11. The method according to claim 1, wherein: the plate-like object is a flat panel display.

* * * * *